United States Patent
Chang et al.

(10) Patent No.: US 6,261,903 B1
(45) Date of Patent: Jul. 17, 2001

(54) FLOATING GATE METHOD AND DEVICE

(75) Inventors: A. J. Chang; Kuo-Tung Sung, both of Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/079,140

(22) Filed: May 14, 1998

(51) Int. Cl.$^7$ .................................. H01L 21/336
(52) U.S. Cl. ............................ 438/257; 438/596
(58) Field of Search ....................... 438/257, 265, 438/445, 446, 596, 267, 304

(56) References Cited

U.S. PATENT DOCUMENTS

| | | | |
|---|---|---|---|
| 5,066,992 | 11/1991 | Wu et al. ........................ | 357/23.5 |
| 5,095,344 | * 3/1992 | Harari ............................ | 257/328 |
| 5,440,159 | 8/1995 | Larsen et al. .................. | 257/318 |
| 5,493,534 | 2/1996 | Mok ............................... | 365/226 |
| 5,543,339 | * 8/1996 | Roth et al. ..................... | 438/265 |
| 5,587,951 | 12/1996 | Jazayeri et al. ................ | 365/203 |
| 5,606,532 | 2/1997 | Lambrache et al. ........... | 365/238.5 |
| 5,680,346 | 10/1997 | Pathak et al. .................. | 365/185.1 |
| 5,756,384 | * 5/1998 | Tseng ............................. | 438/257 |
| 5,981,993 | * 11/1999 | Cho ................................ | 257/311 |

* cited by examiner

*Primary Examiner*—Michael Trinh
*Assistant Examiner*—Jeff Vockrodt
(74) *Attorney, Agent, or Firm*—Townsend and Townsend and Crew, LLP

(57) ABSTRACT

The present invention provides a novel integrated circuit device, which has a flash memory cell. The flash memory cell (100) has a tunnel dielectric layer (113) overlying a surface of a semiconductor substrate. A floating gate layer (107) is defined overlying the tunnel dielectric layer. The gate layer has an edge defined thereon, where a sidewall spacer (108) extends along and on the edge. The sidewall spacer includes a first portion defined adjacent to the edge and a second portion extending from the first portion to a region substantially outside the edge. The combination of the sidewall spacer and the gate layer provide a novel surface for increasing gate coupling ratio.

7 Claims, 6 Drawing Sheets

FLOATING GATE METHOD AND DEVICE

BACKGROUND OF THE INVENTION

The present invention relates to the manufacture of semiconductor integrated circuits. More particularly, the invention is illustrated with regard to memory cell structures for a flash memory cell or flash E²PROM or EPROM cell, but it will be recognized that the invention has a wider range of applicability. Merely by way of example, the present invention can be applied to a variety of embedded memory cell structures such as microprocessors ("MICROs"), microcontrollers, application specific integrated circuits ("ASICs"), and the like.

A variety of memory devices have been proposed or used in industry. An example of such a memory device is an erasable programmable read-only memory ("EPROM") device. The EPROM device is both readable and erasable, i.e., programmable. In particular, an EPROM is implemented using a floating gate field effect transistor, which has binary states. That is, a binary state is represented by the presence of absence of charge on the floating gate. The charge is generally sufficient to prevent conduction even when a normal high signal is applied to the gate of the EPROM transistor.

Numerous varieties of EPROMs are available. In the traditional and most basic form, EPROMs are programmed electrically and erased by exposure to ultraviolet light. These EPROMs are commonly referred to as ultraviolet erasable programmable read-only memories ("UVEPROM"s). UVEPROMs can be programmed by running a high current between a drain and a source of the UVEPROM transistor while applying a positive potential to the gate. The positive potential on the gate attracts energetic (i.e., hot) electrons from the drain-to-source current, where the electrons jump or inject into the floating gate and become trapped on the floating gate.

Another form of EPROM is the electrically erasable programmable read-only memory ("EEPROM" or "E²PROM"). EEPROMs are often programmed and erased electrically by way of a phenomenon known as Fowler-Nordheim tunneling. Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling, and are commonly called "Flash cells" or "Flash devices."

A limitation with the flash memory cell is high voltage is often required to program the device. In some conventional devices, the high voltage can be up to double the amount of voltage needed to operate the device. As device size becomes smaller, high voltage is often detrimental to the operation of the device, as well as its reliability. In particular, high voltages often require a high voltage supply, which uses a more efficient voltage pump. This voltage pump generally requires a thicker oxide for the transistor device, which is often more difficult to make accurately. Additionally, higher voltages often lead to reliability and quality problems. These and other limitations exist in conventional flash memory devices. From the above it is seen that a flash memory cell structure that is easy to fabricate, cost effective, and reliable is often desired.

From the above, it is seen that an improved isolation structure for an integrated circuit device is highly desirable.

SUMMARY OF THE INVENTION

The present invention provides a technique, including a method and device, for an improved flash memory device. In particular, the present invention provides a novel gate structure, including floating and control gates, for a flash memory cell.

In a specific embodiment, the present invention provides a novel integrated circuit device, which has a flash memory cell. The flash memory cell has a tunnel dielectric layer overlying a surface of a semiconductor substrate. A floating gate layer is defined overlying the tunnel dielectric layer. The gate layer has an edge defined thereon, where a sidewall spacer extends along and on the edge. The sidewall spacer includes a first portion defined adjacent to the edge and a second portion extending from the first portion to a region substantially outside the edge. The combination of the sidewall spacer and the gate layer provide a novel surface for increasing gate coupling ratio ("GCR").

In an alternative embodiment, the present invention provides a novel method for forming an integrated circuit device that includes a flash memory cell. The method includes steps of forming a tunnel dielectric layer overlying a surface of a semiconductor substrate, and forming a floating gate layer overlying the tunnel dielectric layer. The gate layer has an edge defined thereon. The method also includes a step of forming a sidewall spacer extending along and on the edge. The sidewall spacer has a first portion defined adjacent to the edge and a second portion extending from the first portion to a region substantially outside the edge. Among other features, the combination of the sidewall spacer and the gate layer provides a novel surface structure for increasing GCR.

Numerous benefits are achieved in one or more embodiments of the present invention over conventional techniques. For example, the present invention provides a relatively simple structure to increase a gate coupling ratio of a flash memory device in an embodiment. The increased gate coupling ratio leads to lower voltages needed to program the device. Additionally, the present invention uses a simple technique for manufacturing the novel flash memory cell. This technique relies on conventional technology including sidewall spacers. These and other benefits are described throughout the present specification, and more particularly below.

The present invention achieves these benefits in the context of known process technology. A further understanding of the nature and advantages of the present invention, however, may be realized by reference to the latter portions of the specification and attached drawings.

DESCRIPTION OF THE SPECIFIC EMBODIMENTS

I. CONVENTIONAL DEVICE STRUCTURE

Figure 1:
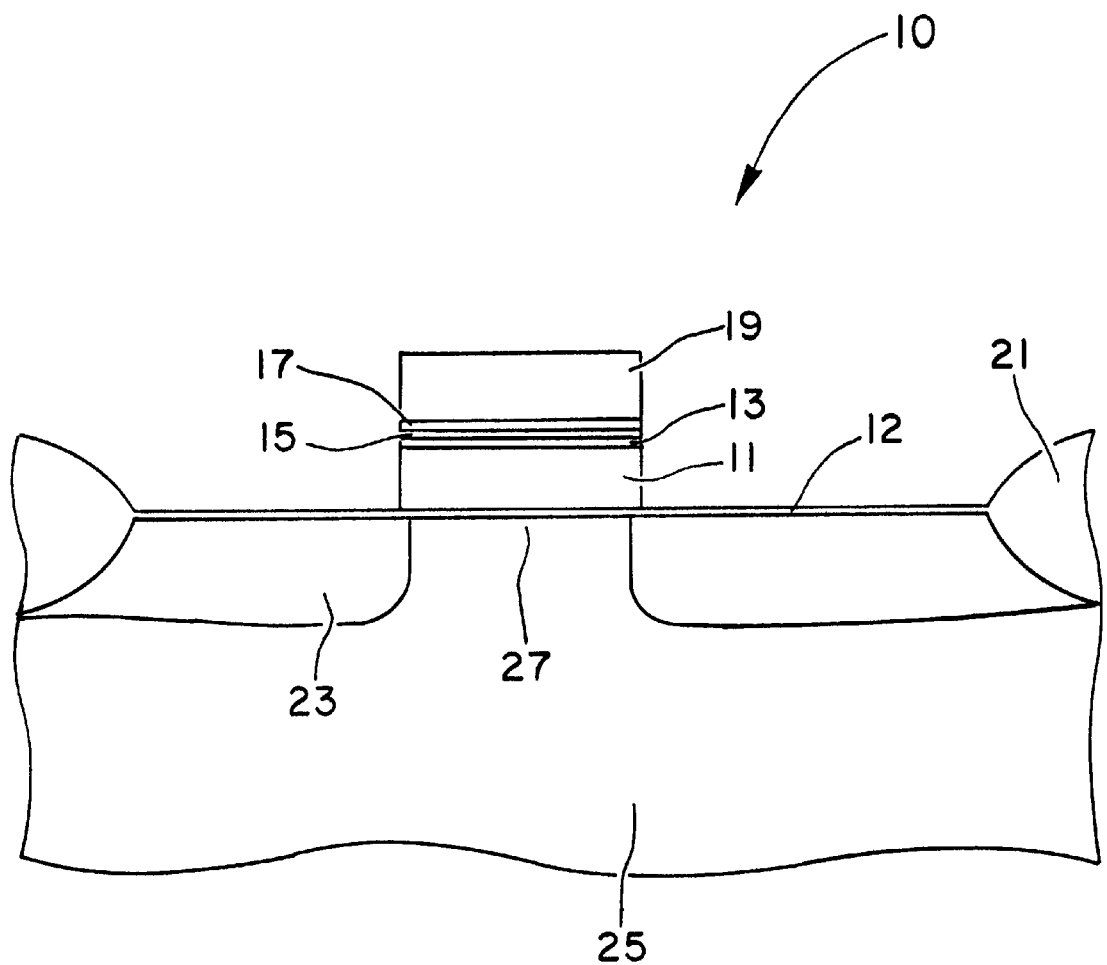
FIG. 1 a simplified cross-sectional view diagram of a conventional flash memory device.

FIG. 1 is a simplified cross-sectional view diagram of a conventional flash memory device 10. This memory device 10 includes source/drain regions 23, which are defined in substrate 25. Field isolation oxide regions 21 are defined in the substrate 25 to isolate the memory device 10. A gate structure including a floating gate 11 and a control gate 19 is defined overlying an oxide layer 12, which is defined overlying the substrate 25. Oxide layer 12 is commonly termed the "tunnel oxide," since electrons tunnel through the oxide layer to the floating gate. A dielectric layer is sandwiched between the floating gate 11 and the control gate 19. The dielectric layer includes an oxide layer 13, which is defined overlying the floating gate 11. A nitride layer 15 is defined overlying the oxide layer 13. Another oxide layer 17 is defined overlying the nitride layer 15. The combination of the two oxide layers and the nitride layer sandwiched in between is commonly called an "ONO" structure. An example of this memory device is one developed by Intel Corporation ("Intel"). Intel called its process FLOTOX (i.e., FLoating gate Tunneling OXide). Other processes are called, for example, FETMOX, SIMOS, etc., which differ slightly from company to company.

The general storage cell structure includes an access transistor and a double polysilicon storage cell with a floating polysilicon gate isolated in silicon dioxide, which is capacitively coupled to a second polysilicon control gate, which is stacked directly above the floating gate. The memory cell can be used in NMOS, as well as CMOS technology.

The storage cell is erased by Fowler-Nordheim tunneling of electrons. For example, selected voltages are applied to the $V_{DD}$, $V_{BB}$, and $V_{PP}$ to inject electrons through the thin oxide layer from the floating gate to the junction. The floating gate thereby becomes relatively more positively charged. This shifts the threshold voltage in the negative direction so that in the READ mode the transistor will be "on." In the program mode the control gate is at a high voltage while a fixed voltage is applied to the drain junction to generate hot electrons. These hot electrons have sufficient energy to overcome the oxide barrier and enter into the floating gate. The threshold voltage thereby shifts in the positive direction so that in the read mode the transistor will be "off." Typically, the erased state corresponds to a logical "1" stored in the cell, and the programmed state corresponds to a logical "0" stored in the cell. Of course, in particular implementations, the reverse notational convention can also be used such that an erased state corresponds to a logical "0" and a programmed state corresponds to a logical "1".

Numerous limitations exist in this conventional cell structure. As device size becomes smaller, it becomes advantageous to use lower voltages on the control gate to program the device. Lower voltages are often achieved by way of a higher gate coupling ratio. Gate coupling ratio is defined according to the simplified expression:

GCR $C_{ono}/(C_{tox}+C_{ono})$ where
GCR is the gate coupling ratio;
$C_{ono}$ is capacitance of the oxide/nitride/oxide; and
$C_{tox}$ is capacitance of the tunnel oxide.

As shown in the above expression, GCR is generally increased by decreasing the thickness of the tunnel oxide layer, which reduces capacitance of such layer. Unfortunately, it is generally impossible to maintain effective device performance having a tunnel oxide thickness of less than about 110 Angstroms for devices having a channel length of less than about 1.5 microns. Additionally, the geometric configuration of the conventional device limits relative area of the tunnel oxide layer to the ONO layer. Accordingly, GCR simply cannot be adjusted in an easy and cost effective manner. Some manufacturers have attempted to provide different geometric configurations from the conventional device shown by FIG. 1, but such configurations often come with the additional expense or limitation in processing the device.

II. PRESENT DEVICE STRUCTURE AND METHOD

Figure 2A:
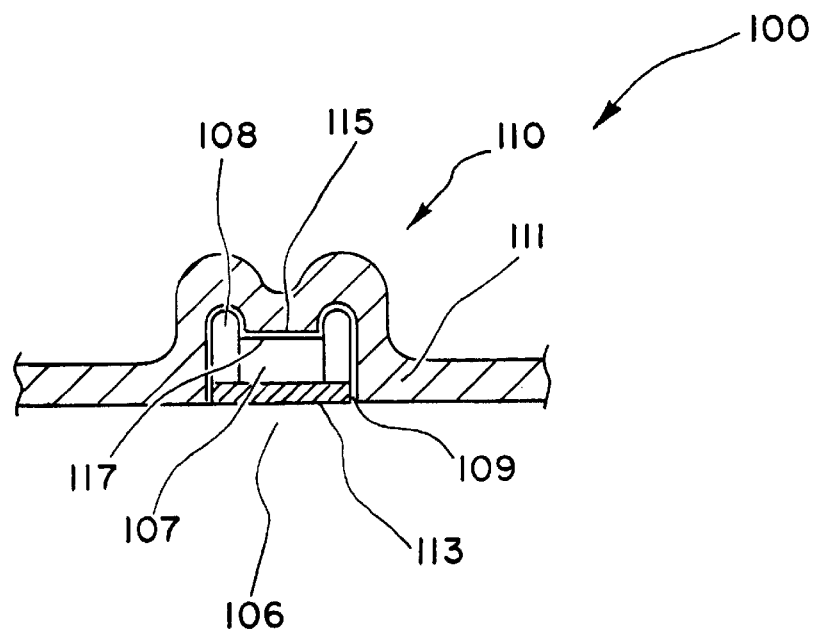
FIGS. 2A–2D are simplified diagrams of a flash memory device according to embodiments of the present invention.

FIGS. 2A–2D are simplified diagrams of a flash memory device according to embodiments the present invention. These diagrams are merely examples and should not limit the scope of the claims herein. One of ordinary skill in the art would recognize other alternatives, variations, and modifications. In FIG. 2A, for example, memory device 100 includes a variety of features such as field isolation oxide regions, which are used to isolate the active device regions. The device also includes source/drain regions in a well region.

A stacked gate structure 110 is defined overlying a channel region 106. A thin gate dielectric layer 113 is defined overlying channel region 106. The thin gate dielectric layer is often made of a high quality oxide layer such as thermal oxide or the like. The stacked gate structure 110 includes at least two gate structures, including floating gate 107 and control gate 111. The floating gate and the control gate are separated from each other by a dielectric layer 109. This dielectric layer can be a single layer or multiple layers, e.g., oxide on nitride on oxide. Control gate 111 is defined overlying the dielectric layer.

Floating gate 107 is selectively formed to increase GCR in the present device. Floating gate includes a layer of conductive material having top surface 117, which is adjacent to dielectric layer 109. Floating gate 107 also includes sidewall spacers 108, which extend outside the top surface 117. A combination of the conductive material layer and conductive sidewall spacers 108 provides a novel geometric configuration that increases an area that is coupled to control gate 111 while reducing an area that is coupled to channel region 106. In a specific embodiment, the surface of the floating gate that is capacitively coupled to the control gate is much larger than the surface of the floating gate that is capacitively coupled to the dielectric or tunnel oxide layer.

Figure 2B:
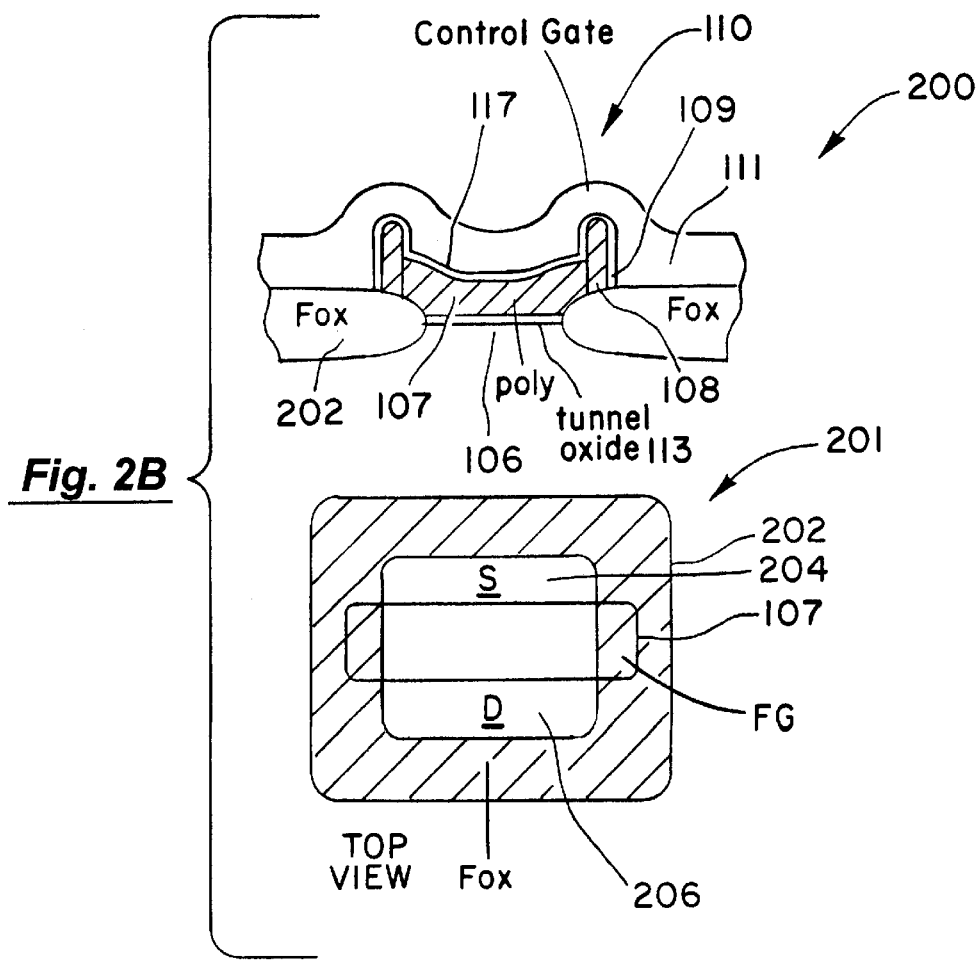

In FIG. 2B, for example, memory device 200 includes a variety of features such as field isolation oxide regions 202, which are used to isolate the active device regions, which is shown in the simplified side-view diagram. The device also includes source/drain regions 204, 206 in a well region, as shown in the simplified top-view diagram 201. Some like reference numerals are used in these Figures as shown in the above Figures.

A stacked gate structure 110 is defined overlying a channel region 106. A thin gate dielectric layer 113 is defined overlying channel region 106. The thin gate dielectric layer is often made of a high quality oxide layer such as thermal oxide or the like. The stacked gate structure 110 includes at least two gate structures, including floating gate 107 and control gate 111. The floating gate and the control gate are separated from each other by a dielectric layer 109. This dielectric layer can be a single layer or multiple layers, e.g., oxide on nitride on oxide. Control gate 111 is defined overlying the floating gate including sidewall spacers and field oxide regions.

Floating gate 107 is selectively formed to increase GCR in the present device. Floating gate includes a layer of conductive material having top surface 117, which is adjacent to dielectric layer 109. Floating gate 107 also includes sidewall spacers 108, which extend outside the top surface 117 and sit on the field oxide regions. Floating gate extends diagonally across active region and ends at field oxide regions. A combination of the conductive material layer and conductive sidewall spacers 108 provides a novel geometric configuration that increases an area that is coupled to control gate 111 while reducing an area that is coupled to channel region 106. In a specific embodiment, the surface of the floating gate that is capacitively coupled to the control gate is much larger than the surface of the floating gate that is capacitively coupled to the dielectric or tunnel oxide layer.

Figure 2C:
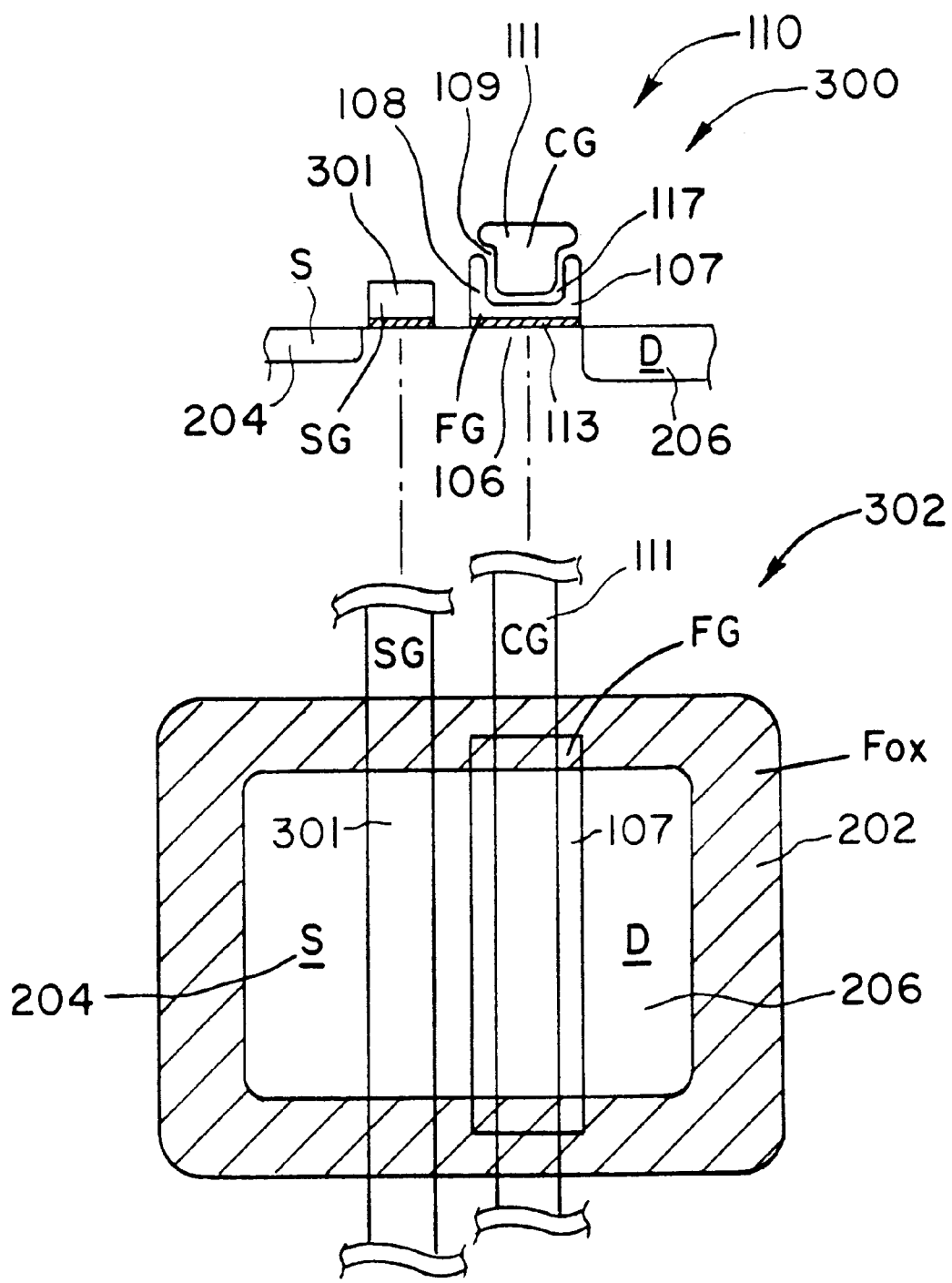

In FIG. 2C, for example, memory device 300 includes a variety of features such as field isolation oxide regions 202, which are used to isolate the active device regions, which is shown in the simplified side-view diagram. The device also includes source/drain regions 204, 206 in a well region, as shown in the simplified top-view diagram 302. Some like reference numerals are used in these Figures as shown in the above Figures.

A stacked gate structure 110 is defined overlying a channel region 106. A thin gate dielectric layer 113 is defined overlying channel region 106. The thin gate dielectric layer is often made of a high quality oxide layer such as thermal oxide or the like. The stacked gate structure 110 includes at least two gate structures, including floating gate 107 and control gate 111. The floating gate and the control gate are separated from each other by a dielectric layer 109. This dielectric layer can be a single layer or multiple layers, e.g., oxide on nitride on oxide. Control gate 111 is defined overlying the floating gate with sidewall spacers and field oxide regions. Control gate does not extend over outside edges of the sidewall spacers. A select gate 301 is also shown. Select gate 301 overlies a thin layer of gate oxide.

Floating gate 107 is selectively formed to increase GCR in the present device. Floating gate includes a layer of conductive material having top surface 117, which is adjacent to dielectric layer 109. Floating gate 107 also includes sidewall spacers 108, which extend outside the top surface 117. A combination of the conductive material layer and conductive sidewall spacers 108 provides a novel geometric configuration that increases an area that is coupled to control gate 111 while reducing an area that is coupled to channel region 106. In a specific embodiment, the surface of the floating gate that is capacitively coupled to the control gate is much larger than the surface of the floating gate that is capacitively coupled to the dielectric or tunnel oxide layer.

Figure 2D:
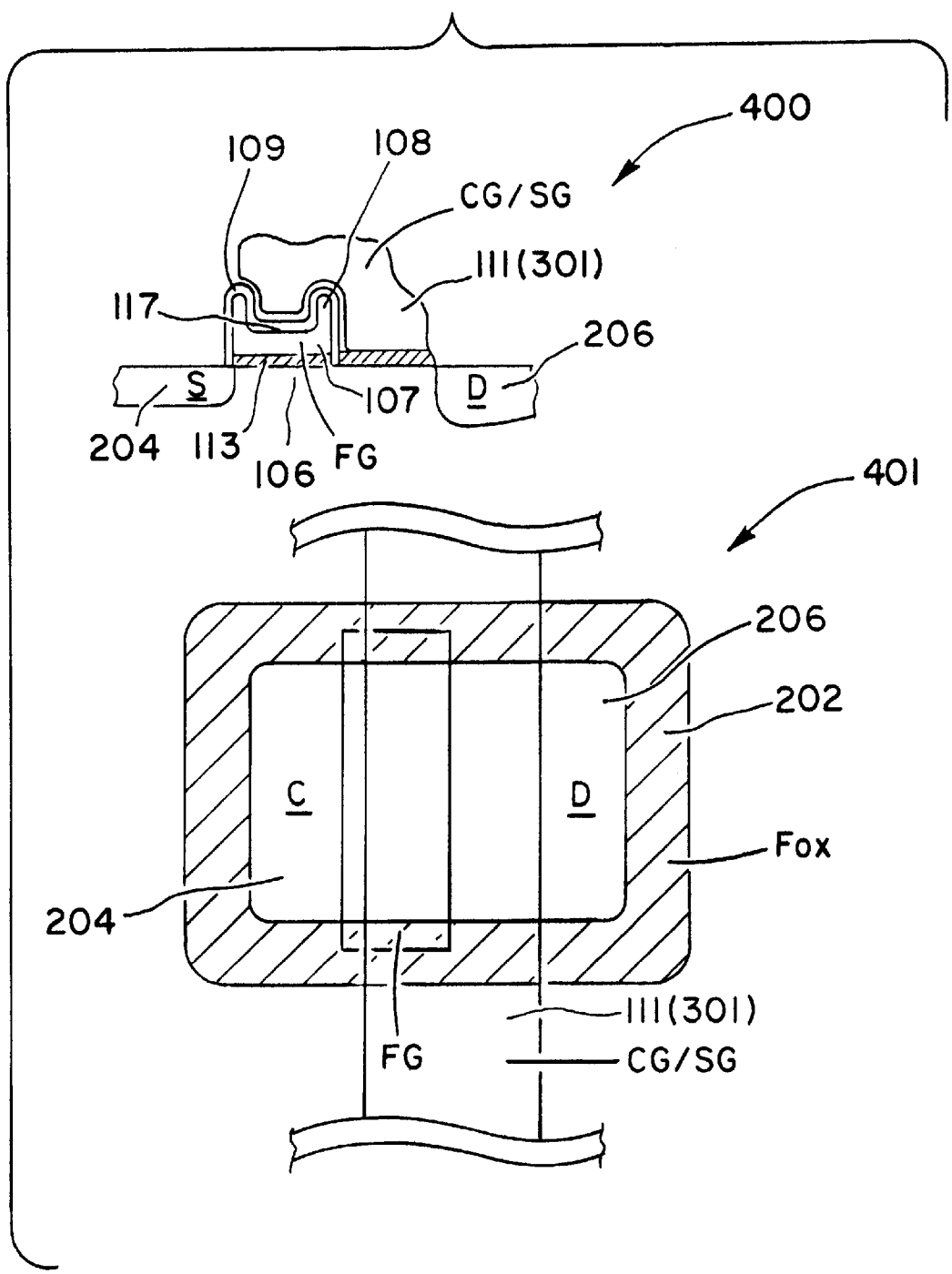

In FIG. 2D, for example, memory device 400 includes a variety of features such as field isolation oxide regions 202, which are used to isolate the active device regions and is shown in the simplified side-view diagram. The device also includes source/drain regions 204, 206 in a well region, as shown in the simplified top-view diagram 401. Some like reference numerals are used in these Figures as shown in the above Figures.

A stacked gate structure 110 is defined overlying a channel region 106. A thin gate dielectric layer 113 is defined overlying channel region 106. The thin gate dielectric layer is often made of a high quality oxide layer such as thermal oxide or the like. The stacked gate structure 110 includes at least two gate structures, including floating gate 107 and control gate (and select gate combination) 111. The floating gate and the control gate are separated from each other by a dielectric layer 109. This dielectric layer can be a single layer or multiple layers, e.g., oxide on nitride on oxide. Control gate 111 is defined overlying the floating gate, including a center region of the floating gate interior portions of both sidewall spacers, and an edge region of the sidewall spacer to form a split gate-type structure. Control gate also extends overlying the substrate to the drain region 206.

Floating gate 107 is selectively formed to increase GCR in the present device. Floating gate includes a layer of conductive material having top surface 117, which is adjacent to dielectric layer 109. Floating gate 107 also includes sidewall spacers 108, which extend outside the top surface 117. A combination of the conductive material layer and conductive sidewall spacers 108 provides a novel geometric configuration that increases an area that is coupled to control gate 111 while reducing an area that is coupled to channel region 106. In a specific embodiment, the surface of the floating gate that is capacitively coupled to the control gate is much larger than the surface of the floating gate that is capacitively coupled to the dielectric or tunnel oxide layer.

In the embodiments noted above, GCR increases by increasing the relative area of the top surface (including sidewalls) to the bottom surface, which is coupled to the channel region. Ideally, GCR approaches one in embodiments of the present invention. Practically, however, it is quite difficult for GCR to equal one. Accordingly, GCR ranges from values greater than 0.5, or greater than 0.75, or greater than 0.8, or greater than 0.9 in the embodiments of the present invention, although GCR is not limited to these values. Of course, the final GCR value will depend upon the particular application.

The present invention provides larger values of GCR using a novel fabrication method. This fabrication method uses sidewall spacer technology, which may use less steps than conventional techniques, which are becoming quite complicated. By way of easier fabrication steps, the present invention may provide higher device yields and better device reliability. As merely an example, the present invention uses previously existing technology, which is often considered undesirable, to form a novel device structure.

In a specific embodiment, a method according to the present invention may be briefly outlined as follows:

(1) Provide substrate;
(2) Form field isolation regions on substrate;
(3) Form tunnel dielectric layer on substrate;
(4) Form first polysilicon layer on substrate;
(5) Form thick CVD oxide layer on the polysilicon layer;
(6) Define first polysilicon layer and CVD oxide layer to pattern the first polysilicon layer and the CVD oxide layer;
(7) Form second polysilicon layer on defined layers;
(8) Form sidewall spacers on the defined layers from the second polysilicon layer;
(9) Selectively remove patterned CVD oxide layer to form floating gate from the sidewall spacers and patterned first polysilicon layer;
(10) Form oxide-on-nitride-on-oxide layer ("ONO" layer) on sidewall spacers and defined first polysilicon layer;
(11) Form third polysilicon layer on the ONO layer;
(12) Define third polysilicon layer to form control gate layer; and
(13) Perform remaining fabrication steps as necessary.

The above sequence of steps is used to define a novel flash memory cell using an improved gate structure. This sequence of steps is merely an illustration and should not limit the scope of the claims herein. One of ordinary skill in the art would recognize other variations, modifications, and alternatives. The novel flash memory cell includes a floating gate layer, which is recessed between sidewall spacers defined on edges of the floating gate layer. Among other features, the present flash memory cell has a higher GCR ratio, which is desirable. Details of a method used to fabricate the present invention are discussed below.

Figure 3:
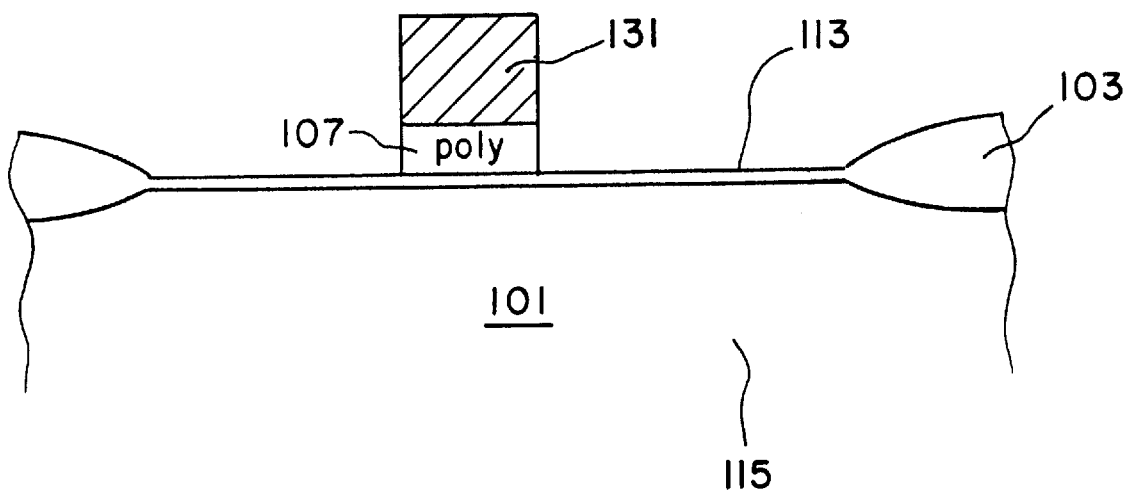
FIGS. 3–6 are simplified cross-sectional view diagrams of a method according to an embodiment of the present invention.
Figure 4:
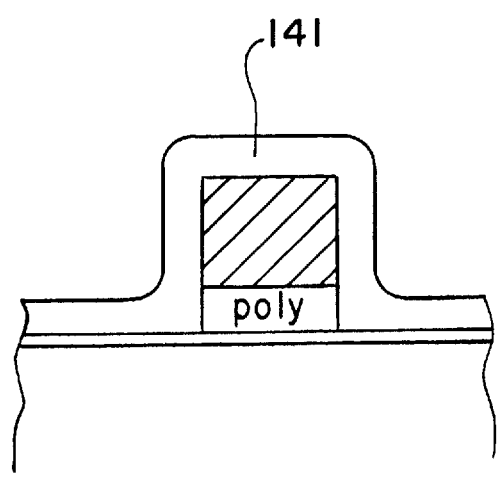

FIGS. 3–6 illustrate a method according to the present invention. This method is merely an example and should not limit the scope of the claims herein. One of ordinary skill in the art would recognize other alternatives, variations, and modifications. As shown, the method begins by providing a semiconductor substrate 115, typically the starting point for the fabrication process. Field oxide regions 103 form onto the semiconductor substrate by use of a technique known in the art, such as the local oxidization of silicon (LOCOS), as shown by FIG. 3. Alternatively, the isolation regions may be trench isolation. Trench isolation can be formed by way of directional or reactive ion etching or milling of the substrate to form trenches or "slits" in the substrate between active regions. These trenches are commonly filled with a dielectric material to isolate a first active region to a second active region. In a CMOS embodiment, for instance, P type well region 101 and N type well region (not shown) are defined onto the semiconductor substrate, which is typically separated by the field oxide region 103. The P type well region 101 and the N type well region define the location for an N type channel device and a P type channel device, respectively.

A gate oxide layer 113 is grown overlying both the P type and N type well regions. The gate oxide layer is typically a thin layer of oxide, but is not limited to the oxide material. Other materials such as silicon oxynitride, silicon nitride, and the like, may also be used. In some embodiments, a step of ion implanting P type conductivity impurities into the substrate defines a buried region, which acts as a channel stop region. The ion implant step is also used to adjust the threshold voltage of each of the devices. The buried channel is of P type conductivity.

A polysilicon layer (or gate layer) is formed overlying the surface of the gate oxide layer. The gate layer is commonly made of polysilicon and is also known as the poly 1 layer and the like. The gate polysilicon layer is often doped with an N type dopant such as phosphorus and the like. Doping can occur using POCl$_3$ diffusion, in-situ doping techniques, and implantation techniques. The gate polysilicon can be formed in a polycrystalline state or an amorphous state, which is later converted into the polycrystalline state. Amorphous silicon can be formed using low temperatures, e.g., 550 degrees C. and less.

A dielectric layer is deposited overlying the floating gate layer. The dielectric layer can be any suitable material such as an oxide layer or a nitride layer. In a specific embodiment, the dielectric layer is an oxide layer made of chemical vapor deposition, which is commonly termed a CVD oxide layer. (The CVD oxide layer is preferably made by way of a silicon bearing compound and an oxygen bearing compound. As merely an example, the dielectric layer is defined to form structure 131 and may be SOG, BPSG, NSG, and others.)

A masking step defines a floating gate region or floating gate layer 107 and dielectric region 131 from the polysilicon layer and the dielectric layer, respectively, as shown by FIG. 3. In particular, the floating gate region and the dielectric region are often formed by standard process steps such as masking, exposing, developing, etching, and others. The underlying oxide layer typically acts as an etch stop during the etching step, and often remains overlying both the N type and P type well regions. As illustrated, the floating gate region and the dielectric layer region include edges having substantially vertical sides, but are not limited to these types of sides. The vertical sides are made by way of plasma processing or wet processing in some cases. Plasma processing occurs using plasma etching tools. These tools can be configured to provide substantially vertical edges, which occur by anisotropic etching processes.

A polysilicon layer 141 is defined overlying the structure of the above Figure. The polysilicon layer is conformal. It is formed using chemical vapor deposition techniques. The polysilicon layer is known as the poly 2 layer and the like. The polysilicon layer is often doped with an N type impurity such as phosphorus and the like. Doping can occur using POCl$_3$ diffusion, in-situ doping techniques, and implantation techniques. The polysilicon can be formed in a polycrystalline state or an amorphous state, which is later converted into the polycrystalline state. Amorphous silicon can be formed using low temperatures, e.g., 550 degrees C. and less. Preferably, polysilicon layer 141 is in electrical and physical contact with the floating gate region, which is also made of polysilicon. In a specific embodiment, the polysilicon layer 141 is substantially the same in characteristic (e.g., dopant concentration, structure) as floating gate region.

Figure 5:
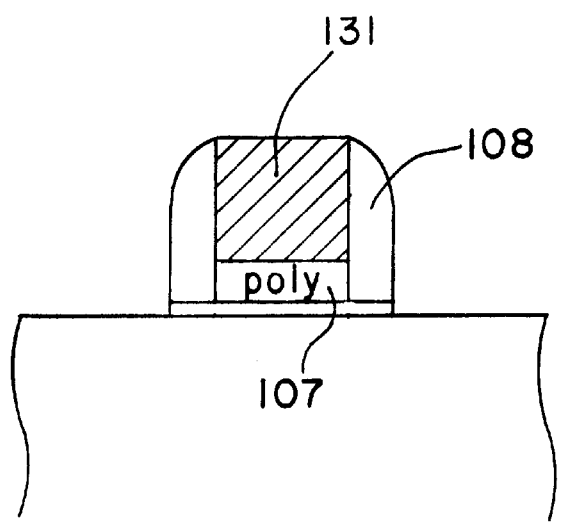

An etching process is used to define the polysilicon layer 141 to form sidewall spacers 108, which are shown in FIG. 5. The etching process can be any suitable directional etching technique. As merely an example, a reactive ion etching process can be used to define the sidewall spacers. The reactive ion etching process substantially removes horizontal portions of the polysilicon layer 141 while leaving the vertical sections or spacers 108 substantially intact. The sidewall spacers are defined on edges of the polysilicon region 107 and the dielectric region 131.

Figure 6:
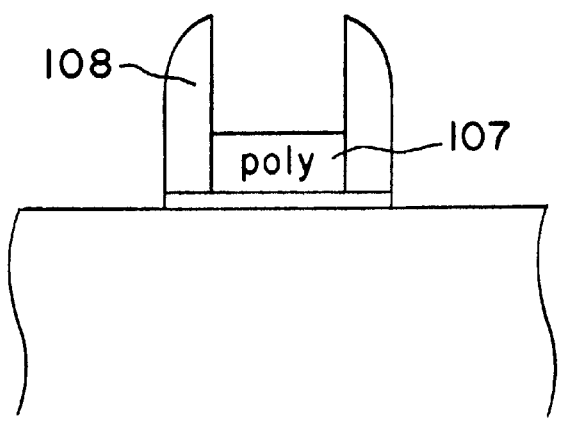

A selective etching step removes the dielectric region 131 from the polysilicon region 107, as illustrated by FIG. 6. The selective etching step may be a dry etching technique or a wet etching technique. An example of a wet etching technique can use hydrofluoric acid or the like. A plasma etching technique may use a fluorine bearing compound or the like. Of course, the type of etching technique used depends upon the application. As shown, the sidewall spacers protrude outwardly and extend beyond the surface of the polysilicon region. That is, a first portion of a sidewall spacer is defined along the edge of the floating gate layer and a second portion of the sidewall spacer, which was previously defined along the edge of the dielectric layer region, extends outwardly, since the dielectric region is no longer present.

A dielectric layer 109 forms overlying the surface of the floating gate layer. The dielectric layer can be an oxide layer, a nitride layer, or any combination thereof. In a preferred embodiment, the dielectric layer is a silicon nitride layer, which is sandwiched between two oxide layers. As shown, the dielectric layer forms overlying the top surface of the floating gate region and the sidewalls to enclose and isolate the floating gate structure, which includes the floating gate region and the sidewalls. The dielectric layer is preferably made by way of thermal oxidation or nitridation or the like. This forms a high quality dielectric layer to isolate and insulate the floating gate structure from a control gate layer.

A control gate layer is defined overlying the dielectric layer to form the structure shown in, for example, FIG. 2. The control gate layer is preferably a polysilicon layer. The polysilicon layer is generally doped with impurities such as an N− type impurity. The N− type impurity is diffused, implanted, or in-situ doped. In most cases, it is desirable to in-situ dope the impurity into the control gate layer to prevent any possible damage to the dielectric layer. Alternatively, a lower temperature diffusion process may be used to introduce impurities into the control gate layer.

In addition to those steps described above, LDD implants are made to form the N− type and P− type LDD regions. A mask typically of photoresist overlying the top surface of the substrate exposes regions for the N− type LDD implant. The N− type implant forms the N− type LDD regions for an N type channel device. The mask is then stripped by way of standard techniques in the art. Another mask exposes P− type LDD regions for the P– type LDD implant. The P– type implant forms the P– type LDD regions for a P type channel device. The mask is then stripped. Source/drain regions are defined in the memory device. An N+ type implant is made to define source/drain regions of the N– type impurity device. A P+ type implant is made to define source/drain regions of the P– type impurity device. To complete the cell structure, the method undergoes steps of applying an inter-dielectric film overlying the surface region of the memory device of FIG. 2, for example. Contact regions or vias are made in the inter-dielectric film. Remaining fabrications steps are performed to complete the device.

The embodiment described above is merely a single flash memory device with a novel gate structure. Integrated circuits include one or more of these devices in a cell. Thousands, millions, billions, and even trillions of these devices are formed in a single integrated circuit chip. Thus, the integrated circuit chip can have 4 Meg., 16 Meg. 64 Meg. 256 Meg., 1 Gig. or more devices on a single sliver of silicon. The channel length of these devices range from about 0.4 µm to 0.25 µm and less. The flash memory device can be formed in a stand alone integrated circuit chip, commonly termed the FLASH memory chip, in some embodiments. Alternatively, the flash memory device can be integrated into a microprocessor, microcomputer, digital signal processor, application specific integrated circuit, and the like. Of course, the number of cells and design size depend highly upon the application.

Although the above descriptions have been described in terms of a stacked gate flash cell, a variety of other flash memory cells can be used. For example, the present invention can be applied to cells using processes called split gate flash, and others. Of course, the type of cell or process used depends upon the application.

While the above is a full description of the specific embodiments, various modifications, alternative constructions and equivalents may be used. For example, while the description above is in terms generally to a flash memory structure, it would be possible to implement the present invention embedded structures. For example, these embedded structures include, among others, microprocessors, microcontrollers, and the like. Additionally, the flash memory structure can be integrated into an application specific integrated circuit ("ASIC") or the like. Therefore, the above description and illustrations should not be taken as limiting the scope of the present invention which is defined by the appended claims.

What is claimed is:

1. A method for forming an integrated circuit device, said integrated circuit comprising a flash memory cell, said method comprising:
    forming a tunnel dielectric layer overlying a surface of a semiconductor substrate;
    forming a floating gate layer overlying the tunnel dielectric layer, the gate layer having an edge defined thereon;
    forming a sidewall spacer extending along and on the edge and extending beyond the edge, the sidewall spacer comprising a first portion defined adjacent to the edge and a second portion extending from the first portion to a region substantially outside the edge, said sidewall spacer having an outer surface opposite said edge, wherein the sidewall spacer is made of substantially the same material as the floating gate layer;
    forming a dielectric layer over said sidewall spacer and over said floating gate; and
    forming a control gate layer over said dielectric layer, but not over said outer surface.

2. The method of claim 1 wherein the integrated circuit device is a flash EEPROM device.

3. The method of claim 1 wherein the floating gate layer comprises polysilicon.

4. The method of claim 1 wherein the tunnel dielectric layer comprises oxide.

5. The method of claim 1 wherein the sidewall is in electrical contact with the floating gate layer.

6. A method for forming an integrated circuit device, said integrated circuit comprising a flash memory cell, said method comprising:
    forming a tunnel dielectric layer overlying a surface of a semiconductor substrate;
    forming a floating gate layer overlying the tunnel dielectric layer, the gate layer having an edge defined thereon;
    forming a sidewall spacer extending along and on the edge and extending beyond the edge, the sidewall spacer comprising a first portion defined adjacent to the edge and a second portion extending from the first portion to a region substantially outside the edge, said sidewall spacer having an outer surface opposite said edge;
    forming a dielectric layer over said sidewall spacer and over said floating gate; and
    forming a control gate layer over said dielectric layer, but not over said outer surface;
    wherein the sidewall spacer comprises polysilicon.

7. A method for forming an integrated circuit device, said integrated circuit comprising a flash memory cell, said method comprising:
    forming a tunnel dielectric layer overlying a surface of a semiconductor substrate;
    forming a floating gate layer overlying the tunnel dielectric layer, the gate layer having an edge defined thereon;
    forming a sidewall spacer extending along and on the edge and extending beyond the edge, the sidewall spacer comprising a first portion defined adjacent to the edge and a second portion extending from the first portion to a region substantially outside the edge, said sidewall spacer having an outer surface opposite said edge;
    forming a dielectric layer over said sidewall spacer and over said floating gate; and
    forming a control gate layer over said dielectric layer, but not over said outer surface;
    wherein the steps of forming the floating gate layer and the sidewall spacer comprises:
        forming a first polysilicon layer overlying the tunnel dielectric layer;
        forming an oxide layer overlying the first polysilicon layer;
        patterning the first polysilicon layer and the oxide layer to define the floating gate layer having the edge, said floating gate layer having a patterned layer of oxide thereon;
        forming a second polysilicon layer overlying the floating gate layer, the edge, and the patterned oxide;
        removing horizontal portions of the second polysilicon layer while leaving vertical portions of the second polysilicon layer intact to define the sidewall spacer on the edge and an edge portion of the patterned oxide; and
        selectively removing the patterned oxide leaving the first portion of the sidewall spacer defined adjacent to the edge and the second portion extending from the first portion to the region substantially outside the edge.

* * * * *